United States Patent
Sabin et al.

(10) Patent No.: US 6,737,745 B2
(45) Date of Patent: May 18, 2004

(54) METHOD FOR RELIEVING BOND STRESS IN AN UNDER-BOND-PAD RESISTOR

(75) Inventors: Gregory D. Sabin, Allentown, PA (US); William J. Gross, Chandler, AZ (US); Jung-Yueh Chang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/247,253

(22) Filed: Sep. 18, 2002

(65) Prior Publication Data

US 2003/0017691 A1 Jan. 23, 2003

Related U.S. Application Data

(62) Division of application No. 09/270,942, filed on Mar. 17, 1999, now Pat. No. 6,486,051.

(51) Int. Cl.[7] .............................................. H01L 23/48
(52) U.S. Cl. ................ 257/758; 257/773; 257/786; 257/774; 257/776; 257/775; 257/781
(58) Field of Search ............................. 257/758, 773, 257/786, 774, 776, 775, 781, 698, 780, 784, 737, 765

(56) References Cited

U.S. PATENT DOCUMENTS

| 4,636,832 A | | 1/1987 | Abe et al. |
| 4,984,061 A | | 1/1991 | Matsumoto |
| 5,736,791 A | * | 4/1998 | Fujiki et al. ................. 257/781 |
| 5,751,065 A | * | 5/1998 | Chittipeddi et al. ......... 257/758 |

* cited by examiner

*Primary Examiner*—Matthew Smith
*Assistant Examiner*—Igwe U. Anya
(74) *Attorney, Agent, or Firm*—Blakely, Sokoloff, Taylor & Zafman LLP

(57) ABSTRACT

The present invention is a method and structure for placing resistive circuits underneath a bonding pad in integrated circuit devices such that the resistive circuits are protected from shear and compressive stresses during bonding processes. The resistor is a serpentine wire pattern. A bonding pad is formed above the resistor such that the serpentine pattern extends over the entire bond pad area. The method and structure allow the formation of IC devices with smaller die areas.

9 Claims, 3 Drawing Sheets

METHOD FOR RELIEVING BOND STRESS IN AN UNDER-BOND-PAD RESISTOR

This Application is a Divisional of U.S. Patent Application Ser. No. 09/270,942 entitled "METHOD FOR RELIEVING BOND STRESS IN AN UNDER-BOND-PAD RESISTOR," filed on Mar. 17, 1999 now U.S. Pat. No. 6,486,051.

BACKGROUND OF THE INVENTION

1. Field of the Invention

The present invention relates to the field of semiconductor processing, and more specifically, to placement of active circuitry underneath bonding pads.

2. Background Information

Integrated circuit chips (dice) are manufactured by fabricating a plurality of identical circuits on a semiconductor wafer, scribing the wafer between the circuits, and subsequently breaking apart the wafer into individual chips. The chips are then mounted on lead frames or substrates for packaging and wire bonded for chip external connections. The bonding wire connects the bonding pads on the chip with the lead frame. IC chips can be bonded using thermocompression or ultrasonic techniques. In thermocompression bonding, heat and pressure are applied to the pad and to the underlying substrate in order to achieve the bond. In ultrasonic bonding, sufficient energy is supplied by ultrasonic vibration in order to achieve the bond.

Active circuit elements, including transistors, resistors, capacitors, inductors, and the like, are generally located in the central portion of the semiconductor device, while bonding pads have been located around the periphery of the active region on the chip. Bonding pads are generally not located above the active circuits in order to protect the active circuit elements during bonding processes.

In many instances, it may be desirable to place resistive circuits beneath the bonding pads. For example, it may advantageous to place resistive circuits under bonding pads in order to decrease die area and to reduce parasitic resistance due to long interconnection wires between bonding pads and active regions. However, due to thermal and mechanical stresses occurring during the bonding process, the underlying resistive circuits may become damaged. For example, as the wire and the die are heated during the process of connecting the wire to the bonding pad, the bonding wire is pressed onto the bonding pad. Additional energy may be supplied by ultrasonic vibration in order to form the bond. Pressure and vibration exerted upon the bonding pad may cause microfractures and/or subtle dislocations of the under-bonding-pad resistive structure which may impact the electrical performance of the resistor or may impact its long-term reliability.

Therefore, what is needed is a method for placing a wire resistor beneath an active bonding pad in an integrated circuit device, without damaging or otherwise affecting the performance of the resistive circuit.

SUMMARY OF THE INVENTION

A method for relieving bonding stress in an integrated circuit device having an active circuit placed under a bonding pad is disclosed. The active circuit is formed above a silicon substrate, the active circuit comprising a wire pattern. A dielectric layer is deposited over the wire pattern. A bonding pad is formed over the dielectric layer.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A method and structure for relieving bonding stress from thin film wire resistors placed underneath bonding pads is disclosed. In the following description, numerous specific details are set forth such as specific materials, dimensions, methods, etc. in order to provide a thorough understanding of the present invention. It will be obvious, however, to one skilled in the art that these specific details may not be needed in order to practice the present invention. In other instances, well-known processing steps have not been described in detail in order to avoid unnecessarily obscuring the present invention.

During the process of attaching a bonding wire onto a bonding pad, the bonding pad is subjected to mechanical shock, as the bonding tool brings down the wire and exerts pressure or vibration on the bonding pad. Additionally, during such a bonding process, the bonding pad is subjected to heat in order to achieve a good quality bond. The present invention is a method for forming a wire resistor and placing it underneath an active bonding pad in an integrated circuit device. The structure of the wire itself is able to protect the resistor from the shear and compressive stresses that occur during the bonding process.

Figure 1:
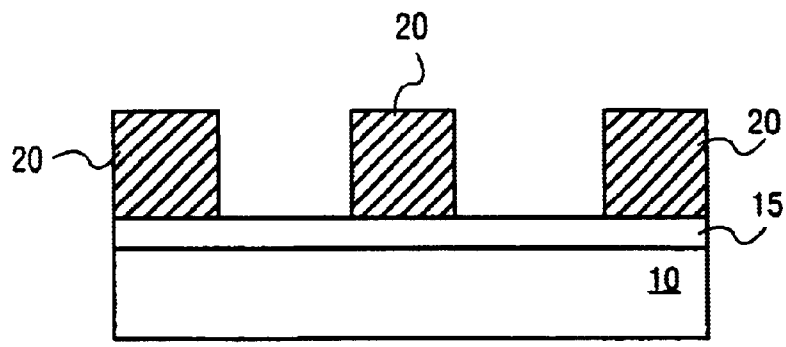
FIG. 1 is a sectional view of a resistor structure according to one embodiment of the present invention.

FIG. 1 illustrates a side view of an integrated circuit. A field oxide layer 15 is formed above a substrate 10. A silicon or metal layer is then deposited above the oxide layer 15. The silicon or metal layer is patterned and then etched in order to form a folded or serpentine resistor 20.

Figure 2:
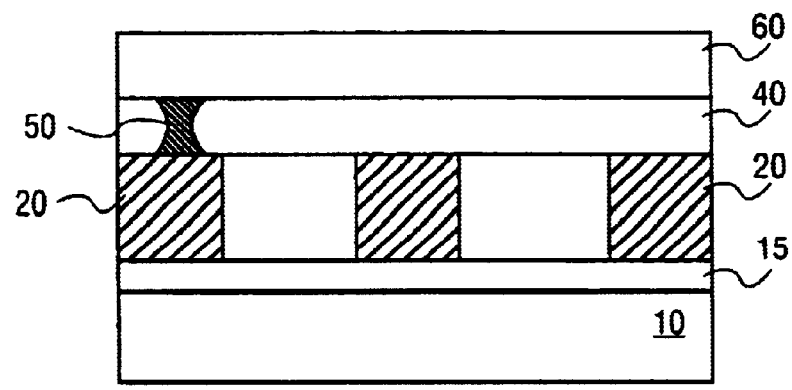
FIG. 2 is a sectional view of the resistor structure of FIG. 1 after a bonding pad has been deposited.

Referring to FIG. 2, an insulating layer, for example dielectric layer 40, is then deposited over resistor 20. The dielectric layer 40 electrically isolates the resistor 20 from the bonding pad 60. Additionally, dielectric layer 40 helps absorb compressive stress and insulates from thermal stress during the bonding process. In one embodiment of the present invention dielectric layer 40 consists of silicon dioxide.

Next, dielectric layer 40 is etched to form via 50. Via 50 provide for electrical coupling between resistor 20 and bonding pad 60. It should be noted that via 50 may be placed in other areas and it should also be noted that more that one via may be used. After via 50 is formed, a bonding pad 60 is formed by depositing a metal layer or a silicon layer over dielectric layer 40.

Figure 3:
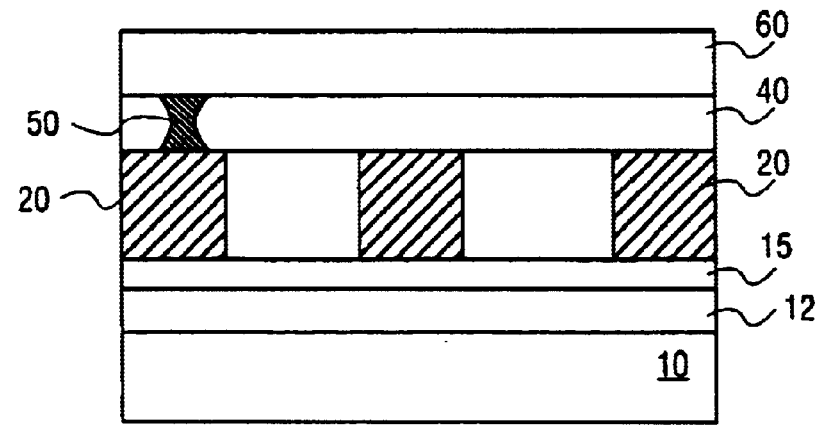
FIG. 3 is a sectional view of an integrated circuit according to another embodiment of the present invention.

It will be appreciated that the resistor 20 may be formed above other active circuits present in the integrated circuit. For example, FIG. 3 illustrates another embodiment of the present invention. The integrated circuit of FIG. 3 contains all the elements of the integrated circuit illustrated in FIG. 2. However, in addition, the integrated circuit of FIG. 3 contains an active circuit 12 formed above the substrate 10. The wire resistor 20, which is formed above the active circuit 12, is able to protect the active circuit 12 from bonding stress. The active circuit 12 may include a resistor, an inductor, a capacitor, a transistor, or any combination thereof.

It should be noted that the windings of the wire pattern do not have to be equally spaced. However, in one embodiment of the present invention, in order to increase the accuracy of the resistance value of the resistor, the line width, $W_L$ 25, is no bigger than the space, $W_S$ 35, between the windings of the wire pattern. For example, in one embodiment of the present invention illustrated in FIG. 4, the line width, $W_L$ 25, of the resistive wire 20 is approximately three fourths the size of the space, $W_S$ 35, between any two adjacent windings 30 of the wire pattern.

Figure 4:
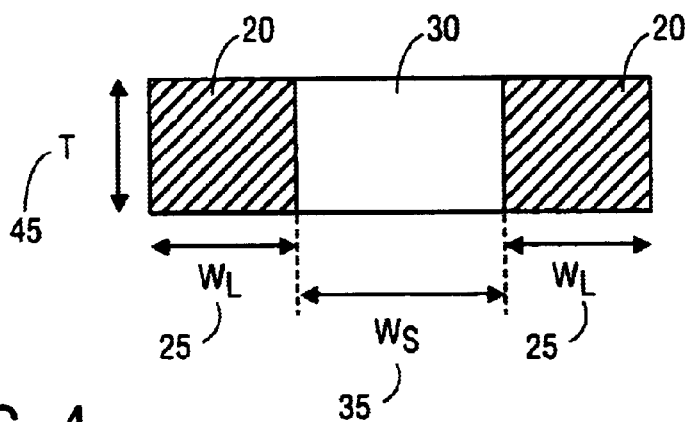
FIG. 4 is a sectional view of a resistor structure according to yet another embodiment of the present invention.

It would be desirable to form a resistive wire of sufficient thickness in order to withstand the shear and compressive stresses, such that microfractures or subtle dislocations of the resistive structure do not impact the electrical performance of the wire or impact its long-term reliability. However, in order to achieve the desired depth and width of the resistive circuit during the etching process of the metal, it would be desirable to form a resistive wire with a width $W_L$ 25 that is no smaller than the wire thickness, T 45, as illustrated in FIG. 4.

Figure 5:
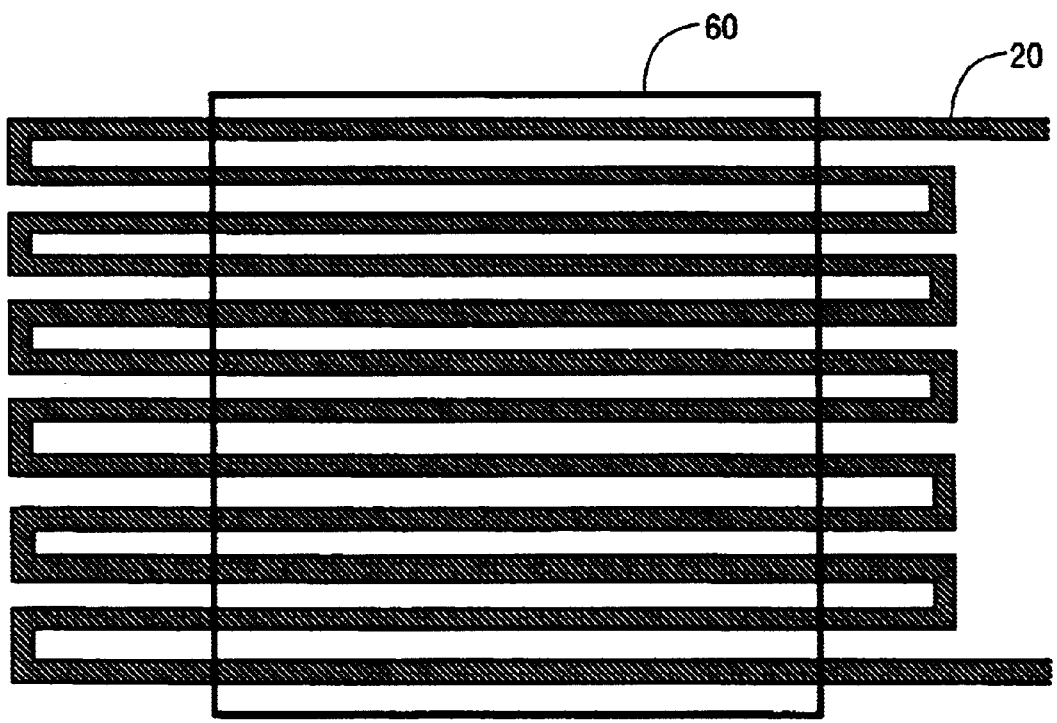
FIG. 5 is a top view of the resistor structure and bonding pad of FIG. 2.

In one embodiment of the present invention, the resistive wire pattern lying underneath the bond pad 60 covers the entire bond pad area. In another embodiment of the present invention, the serpentine resistor 20 is extended beyond the bonding pad area, as is illustrated in FIG. 5. Forming the resistor the size of the bonding pad or extending the resistor beyond the size of the bonding pad allows the wire to be unaffected by the stress of the assembly process.

Figure 6:
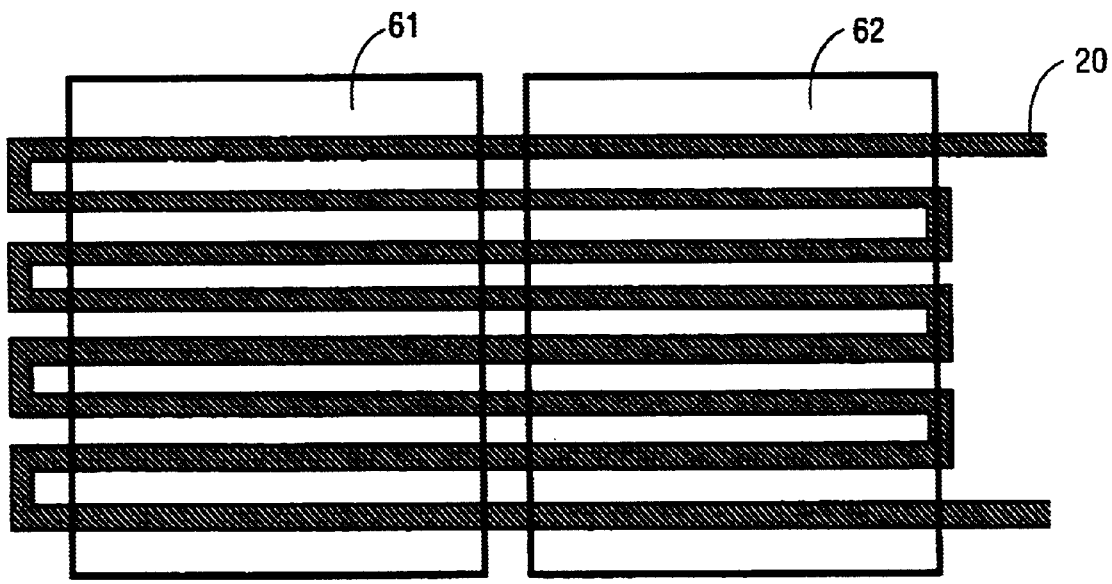
FIG. 6 is a top view of the resistor structure and bonding pads according to still another embodiment of the present invention.

It will be appreciated that the resistance value of the resistive circuit 20 may be adjusted by extending the length of the serpentine wire. Following certain design requirements, including the case when a large resistor is formed, it would be desirable to cover the resistive circuit 20 by more than one bonding pad. The resistor 20 may be electrically connected to one of the bonding pads. FIG. 6 illustrates an integrated circuit according to another embodiment of the present invention, in which two bonding pads, 61 and 62, are formed above a single resistor 20.

An additional advantage of the present invention is that it allows the formation of IC devices with smaller die areas. Typically, a square bonding pad has dimensions of 85 microns to 125 microns. Additionally, prior art IC design rules do not allow the placing of any circuit within 25 microns of a bonding pad. Thus, if the bonding pads are placed on top of resistive circuits, the bonding pads placement is no longer restricted to just the edges of the die. Such a process will reduce the die area by the amount of the combined surface area of each bonding pad and the amount of space required by the design rules.

It should be noted that any of a number of materials may be used to form both the resistive wire pattern and the bonding pad. For example, polysilicon, amorphous silicon, aluminum, and copper may be used to form the resistor 20. The bonding pad may consist of polysilicon, silicon alloys, aluminum, aluminum alloys, copper, copper alloys, gold, gold alloys, or any combination thereof.

Thus, the present invention provides a method for forming a resistive circuit, such that, when placed underneath a bonding pad, the structure of the circuit is able to protect itself from shear and compressive stresses during bonding processes. The present invention accomplishes a reduction in the chip area and eliminates the parasitic resistance due to long interconnection wires between bonding pads and active regions. Although certain specific embodiments have been described, various modifications and changes to the disclosed embodiments will be apparent to one of ordinary skill in the art upon reading this disclosure. Therefore, it is to be understood that the specifications and drawings are merely illustrative of and not restrictive on the broad invention, and that this invention is not limited to the specific embodiments shown and described.

What is claimed is:

1. An integrated circuit device comprising:

a silicon substrate;

an active circuit formed above said substrate, the active circuit selected from the group consisting of a resistor, an inductor, a capacitor, and a transistor;

a wire resistor deposited above the active circuit, the wire resistor having a resistance value determined according to design requirements of the active circuit, thus acting as an active device for the active circuit;

a dielectric layer deposited on the wire resistor; and a bonding pad formed on the dielectric layer.

2. The integrated circuit device as described in claim 1, wherein said wire resistor is formed by depositing a silicon layer or a metal layer above the active circuit and patterning the silicon or metal layer to have a serpentine pattern.

3. The integrated circuit device as described in claim 2, wherein the serpentine pattern has a plurality of windings and wherein a width of the wire resistor is no bigger than a space between any two adjacent windings of the plurality of windings.

4. The integrated circuit device as described in claim 3, wherein the width is approximately three fourths of the space between any two adjacent windings of the plurality of windings.

5. The integrated circuit device as described in claim 2, wherein said wire resistor comprises a material selected from the group of:

polysilicon, amorphous silicon, aluminum, and copper, or any combination thereof.

6. The integrated circuit device as described in claim 1, wherein said active circuit is a resistor.

7. The integrated circuit device as described in claim 1, wherein said dielectric layer comprises silicon dioxide.

8. The integrated circuit device as described in claim 1, wherein said bonding pad comprises a material selected from the group consisting of:

polysilicon, amorphous silicon, aluminum, and copper, or any combination thereof.

9. The integrated circuit device of claim 1 wherein the dielectric layer and the wire resistor are coupled to act as stress reducers.

* * * * *